(12) United States Patent
Koshimizu

(10) Patent No.: US 11,742,184 B2
(45) Date of Patent: Aug. 29, 2023

(54) PLASMA PROCESSING APPARATUS AND PLASMA PROCESSING METHOD

(71) Applicant: Tokyo Electron Limited, Tokyo (JP)

(72) Inventor: Chishio Koshimizu, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 250 days.

(21) Appl. No.: 17/176,300

(22) Filed: Feb. 16, 2021

(65) Prior Publication Data

US 2021/0272775 A1  Sep. 2, 2021

(30) Foreign Application Priority Data

Feb. 28, 2020 (JP) ................................. 2020-033167
Oct. 30, 2020 (JP) ................................. 2020-182790

(51) Int. Cl.
*H01J 37/32* (2006.01)

(52) U.S. Cl.
CPC .. *H01J 37/32183* (2013.01); *H01J 37/32128* (2013.01); *H01J 37/32715* (2013.01)

(58) Field of Classification Search
CPC ........... H01J 37/32183; H01J 37/32128; H01J 37/32715; H01J 37/32146; H01J 37/3244; H01J 37/32412; C23F 1/00; C23F 1/08
See application file for complete search history.

(56) References Cited

U.S. PATENT DOCUMENTS

| | | | |
|---|---|---|---|
| 2010/0213162 A1* | 8/2010 | Mochiki | H01J 37/32091 216/17 |
| 2011/0309049 A1* | 12/2011 | Papasouliotis | H01J 37/32412 427/523 |
| 2018/0166249 A1 | 6/2018 | Dorf et al. | |

FOREIGN PATENT DOCUMENTS

JP  2016-157735 A  9/2016

\* cited by examiner

*Primary Examiner* — Wei (Victor) Y Chan
(74) *Attorney, Agent, or Firm* — Studebaker & Brackett PC

(57) ABSTRACT

The disclosed plasma processing apparatus includes a plasma processing chamber, a substrate support, a bias power source, and a radio frequency power source. The substrate support is disposed in the plasma processing chamber and includes an electrode. The bias power source is coupled to the electrode and configured to generate a bias power having a first frequency. The radio frequency power source is coupled to the plasma processing chamber and configured to generate a radio frequency power having a second frequency higher than the first frequency. The radio frequency power has a first power level in a first period within one cycle of the bias power and has a second power level lower than the first power level in a second period within one cycle of the bias power.

14 Claims, 8 Drawing Sheets

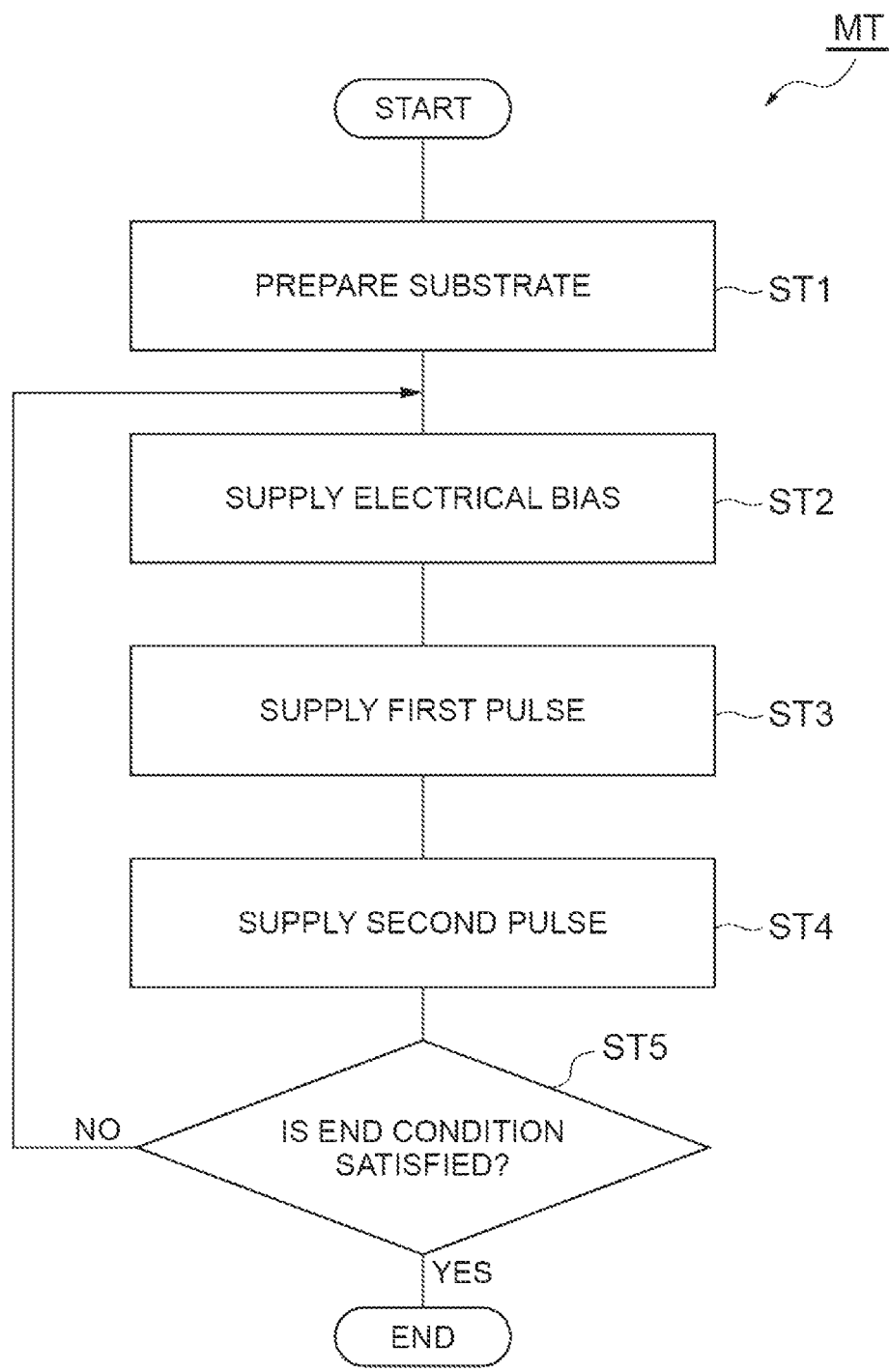

PLASMA PROCESSING APPARATUS AND PLASMA PROCESSING METHOD

CROSS-REFERENCE TO RELATED APPLICATIONS

This application is based on and claims the benefit of priority from Japanese Patent Application No. 2020-033167 filed on Feb. 28, 2020 and Japanese Patent Application No. 2020-182790 filed on Oct. 30, 2020, the entire contents of which are incorporated herein by reference.

TECHNICAL FIELD

Exemplary embodiments of the present disclosure relate to a plasma processing apparatus and a plasma processing method.

BACKGROUND

A plasma processing apparatus is used for processing on a substrate. A type of plasma processing apparatus is provided with a chamber, a placing table, a first radio frequency power source, and a second radio frequency power source. The placing table is configured to support a substrate in the chamber. The placing table includes a lower electrode. The first radio frequency power source is configured to generate radio frequency power for generating plasma from a gas in the chamber. The second radio frequency power source is configured to generate radio frequency bias power for drawing ions from the plasma into the substrate. The radio frequency bias power is supplied to the lower electrode. Japanese Unexamined Patent Publication No. 2016-157735 discloses a plasma processing apparatus configured to supply at least one of radio frequency power and radio frequency bias power as pulsed power.

SUMMARY

In an exemplary embodiment, a plasma processing apparatus is provided. The plasma processing apparatus includes a plasma processing chamber, a substrate support, a bias power source, and a radio frequency power source. The substrate support is disposed in the plasma processing chamber and includes an electrode. The bias power source is coupled to the electrode and configured to generate a bias power having a first frequency. The radio frequency power source is coupled to the plasma processing chamber and configured to generate a radio frequency power having a second frequency higher than the first frequency. The radio frequency power has a first power level in a first period within one cycle of the bias power and has a second power level lower than the first power level in a second period within one cycle of the bias power.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 8 is a flowchart of a plasma processing method according to an exemplary embodiment.

DETAILED DESCRIPTION

Figure 1:
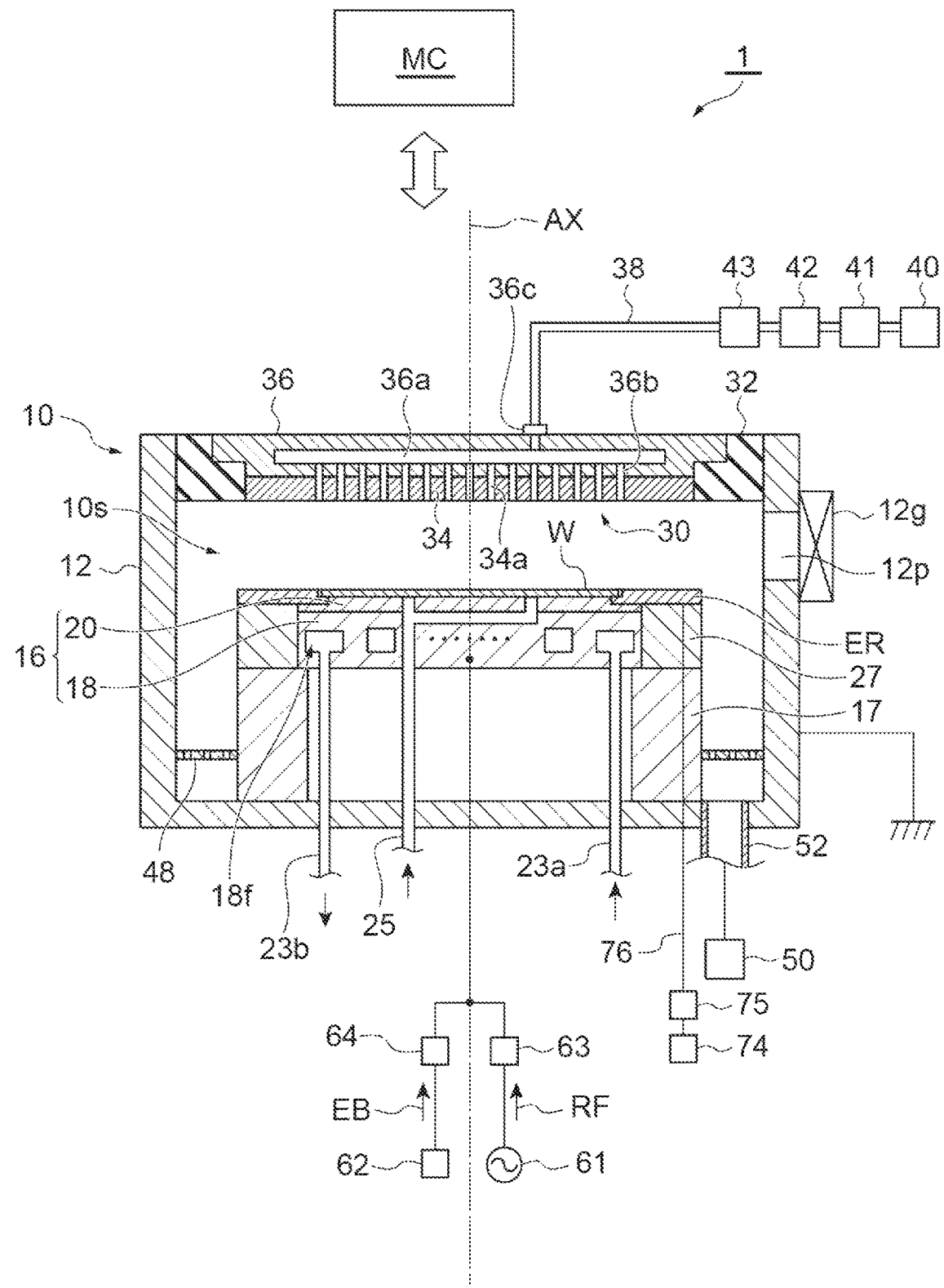
FIG. 1 schematically illustrates a plasma processing apparatus according to an exemplary embodiment.

Hereinafter, various exemplary embodiments will be described.

In an exemplary embodiment, a plasma processing apparatus is provided. The plasma processing apparatus includes a plasma processing chamber, a substrate support, a bias power source, and a radio frequency (RF) power source. The substrate support is disposed in the plasma processing chamber and includes a lower electrode. The bias power source is coupled to the lower electrode and configured to generate bias power having a first frequency. The radio frequency power source is coupled to the plasma processing chamber and configured to generate radio frequency power having a second frequency higher than the first frequency. In an embodiment, the radio frequency power source is coupled to at least one of two facing electrodes, for example, an upper electrode and the lower electrode. The radio frequency power has a first power level in a first period within one cycle of the bias power and has a second power level lower than the first power level in a second period within one cycle of the bias power. One cycle of the bias power is an inherent cycle that is defined by the first frequency. That is, the inherent cycle is the reciprocal of the first frequency. For example, in a case where the first frequency is 400 kHz, the inherent cycle is 2.5 µs. The first period is different from the second period. The second period may be before the first period or after the first period.

In an exemplary embodiment, the bias power includes at least one bias pulse within one cycle. The at least one bias pulse may have a pulse waveform of a rectangular shape, a trapezoidal shape, a triangular shape, or a combination thereof, and may have a shaped pulse (also referred to as a tailored pulse) as disclosed in US2018/0166249A1. The at least one bias pulse has a positive or negative polarity. Further, the at least one bias pulse may include a plurality of bias pulses having positive and/or negative polarities. In an embodiment, the bias power includes at least one positive bias pulse and at least one negative bias pulse within one cycle.

In an exemplary embodiment, the bias power is radio frequency bias power having the first frequency. In an embodiment, the bias power source is configured to continuously generate radio frequency bias power. In this case, the radio frequency bias power does not include an OFF period.

In another exemplary embodiment, a plasma processing apparatus is provided. The plasma processing apparatus includes a chamber, a substrate support, a bias power source, and a radio frequency power source. The substrate support includes a lower electrode and is configured to support a substrate in the chamber. The bias power source is configured to generate an electrical bias for drawing ions into the substrate, and is electrically connected to the lower electrode. The electrical bias varies a potential of the substrate within a cycle that is defined by a first frequency. The radio frequency power source is configured to generate radio frequency power having a second frequency for generating plasma from a gas in the chamber. The radio frequency power source is configured to supply a first pulse of the radio frequency power in a first period and supply a second pulse of the radio frequency power in a second period. The first period at least partially overlaps the cycle that is defined by the first frequency, and has a time length shorter than a time length of the cycle. The second period at least partially overlaps the cycle that is defined by the first frequency, and has a time length shorter than the time length of the cycle. The second pulse has a power level lower than a power level of the first pulse.

In a case where the radio frequency power is continuously supplied, that is, in a case where a continuous wave of the radio frequency power is supplied, the density of the plasma in the chamber becomes high at the center and becomes low on the outer side in a radial direction. In the above embodiment, the radio frequency power is supplied as the first pulse. Therefore, according to the above embodiment, the uniformity of the density distribution in the radial direction of the plasma becomes high. Further, in the above embodiment, after the supply of the first pulse, the second pulse of the radio frequency power having relatively low power is supplied. Therefore, according to the above embodiment, it becomes possible to prevent a decrease or disappearance of the density of the plasma.

In an exemplary embodiment, the electrical bias may be a pulse wave that is generated periodically with the cycle that is defined by the first frequency. The pulse wave includes a pulse of a negative direct-current voltage.

In an exemplary embodiment, each of the first period and the second period may be a period within a period in which the pulse of the negative direct-current voltage from the bias power source is not supplied within the cycle that is defined by the first frequency. According to this embodiment, reflection with respect to each of the first pulse and the second pulse is reduced.

In an exemplary embodiment, the radio frequency power source may be configured to supply radio frequency power having a power level lower than the power level of the first pulse and the power level of the second pulse and larger than 0 W in a period between the first period and the second period.

In an exemplary embodiment, the first period may overlap a period in which the pulse of the negative direct-current voltage from the bias power source is supplied. The second period may be a period within the period in which the pulse of the negative direct-current voltage from the bias power source is not supplied within the cycle.

In an exemplary embodiment, the radio frequency power source may be configured to supply the radio frequency power in a period between the second period within the cycle that is defined by the first frequency and the point in time of end of the cycle. The radio frequency power which is supplied in the period between the second period and the point in time of end of the cycle has a power level lower than the power level of the first pulse and the power level of the second pulse and larger than 0 W.

In an exemplary embodiment, the electrical bias may be radio frequency bias power having the first frequency.

In an exemplary embodiment, the plasma processing apparatus may be further provided with a matcher connected between the bias power source and the lower electrode. The first pulse and the second pulse may be supplied when the impedance of a load on the bias power source is in a substantially matched state.

In still another exemplary embodiment, a plasma processing method is provided. The plasma processing method includes preparing a substrate on a substrate support provided in a chamber of a plasma processing apparatus. The plasma processing apparatus includes a bias power source and a radio frequency power source. The bias power source is configured to generate an electrical bias that varies a potential of the substrate within a cycle that is defined by a first frequency. The radio frequency power source is configured to generate radio frequency power having a second frequency. The plasma processing method includes supplying the electrical bias from the bias power source to a lower electrode of the substrate support. The plasma processing method further includes supplying a first pulse of the radio frequency power from the radio frequency power source in a first period. The first period at least partially overlaps the cycle that is defined by the first frequency, and has a time length shorter than a time length of the cycle. The plasma processing method further includes supplying a second pulse of the radio frequency power from the radio frequency power source in a second period within the cycle which is defined by the first frequency. The second period at least partially overlaps the cycle that is defined by the first frequency, and has a time length shorter than the time length of the cycle. The second pulse has a power level lower than a power level of the first pulse.

Hereinafter, various exemplary embodiments will be described in detail with reference to the drawings. In the drawings, the same or equivalent portions are denoted by the same reference symbols.

FIG. 1 schematically illustrates a plasma processing apparatus according to an exemplary embodiment. A plasma processing apparatus 1 shown in FIG. 1 is a capacitively coupled plasma processing apparatus. The plasma processing apparatus 1 is provided with a plasma processing chamber 10. The chamber 10 provides an internal space 10s therein. The central axis of the internal space 10s is an axis AX extending in the vertical direction. In an embodiment, the chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. A film having plasma resistance is formed on the inner wall surface of the chamber body 12, that is, the wall surface defining the internal space 10s. This film may be a film formed by anodization or a ceramic film such as a film formed of yttrium oxide.

A passage 12p is formed in a side wall of the chamber body 12. A substrate W passes through the passage 12p when it is transferred between the internal space 10s and the outside of the chamber 10. A gate valve 12g is provided along the side wall of the chamber body 12 for the opening and closing of the passage 12p.

The plasma processing apparatus 1 is further provided with a substrate support 16. The substrate support 16 is configured to support the substrate W placed thereon in the chamber 10. The substrate W has a substantially disk shape. The substrate support 16 is supported by a supporting part 17. The supporting part 17 extends upward from a bottom portion of the chamber body 12. The supporting part 17 has a substantially cylindrical shape. The supporting part 17 is formed of an insulating material such as quartz.

The substrate support 16 has a lower electrode 18 and an electrostatic chuck 20. The lower electrode 18 and the electrostatic chuck 20 are provided in the chamber 10. The lower electrode 18 is formed of a conductive material such as aluminum and has a substantially disk shape.

A flow path 18f is formed in the lower electrode 18. The flow path 18f is a flow path for a heat exchange medium. As the heat exchange medium, a liquid refrigerant or a refrigerant (for example, chlorofluorocarbon) that cools the lower electrode 18 by vaporization thereof is used. A supply device for a heat exchange medium (for example, a chiller unit) is connected to the flow path 18f. The supply device is provided outside the chamber 10. The heat exchange medium is supplied from the supply device to the flow path 18f through a pipe 23a. The heat exchange medium supplied to the flow path 18f is returned to the supply device through a pipe 23b.

The electrostatic chuck 20 is provided on the lower electrode 18. When the substrate W is processed in the internal space 10s, the substrate W is placed on the electrostatic chuck 20 and is held by the electrostatic chuck 20.

The electrostatic chuck 20 has a main body and an electrode. The main body of the electrostatic chuck 20 is formed of a dielectric such as aluminum oxide or aluminum nitride. The main body of the electrostatic chuck 20 has a substantially disk shape. The central axis of the electrostatic chuck 20 substantially coincides with the axis AX. The electrode of the electrostatic chuck 20 is provided in the main body. The electrode of the electrostatic chuck 20 has a film shape. A direct-current power source is electrically connected to the electrode of the electrostatic chuck 20 through a switch. When the voltage from the direct-current power source is applied to the electrode of the electrostatic chuck 20, an electrostatic attraction force is generated between the electrostatic chuck 20 and the substrate W. Due to the generated electrostatic attraction force, the substrate W is attracted to and held by the electrostatic chuck 20.

The electrostatic chuck 20 includes a substrate placing region. The substrate placing region is a region having a substantially disk shape. The central axis of the substrate placing region substantially coincides with the axis AX. When the substrate W is processed in the chamber 10, the substrate W is placed on the upper surface of the substrate placing region.

In an embodiment, the electrostatic chuck 20 may further include an edge ring placing region. The edge ring placing region extends in a circumferential direction around the central axis of the electrostatic chuck 20 to surround the substrate placing region. An edge ring ER is mounted on the upper surface of the edge ring placing region. The edge ring ER has a ring shape. The edge ring ER is placed on the edge ring placing region such that the central axis thereof coincides with the axis AX. The substrate W is disposed in a region surrounded by the edge ring ER. That is, the edge ring ER is disposed to surround the edge of the substrate W. The edge ring ER may have electrical conductivity. The edge ring ER is formed of, for example, silicon or silicon carbide. The edge ring ER may be formed of a dielectric such as quartz.

The plasma processing apparatus 1 may be further provided with a gas supply line 25. The gas supply line 25 supplies a heat transfer gas, for example, a He gas, from a gas supply mechanism to a gap between the upper surface of the electrostatic chuck 20 and the rear surface (lower surface) of the substrate W.

The plasma processing apparatus 1 may be further provided with an insulating region 27. The insulating region 27 is disposed on the supporting part 17. The insulating region 27 is disposed outside the lower electrode 18 in a radial direction with respect to the axis AX. The insulating region 27 extends in the circumferential direction along the outer peripheral surface of the lower electrode 18. The insulating region 27 is formed of an insulator such as quartz. The edge ring ER is placed on the insulating region 27 and the edge ring placing region.

The plasma processing apparatus 1 is further provided with an upper electrode 30. The upper electrode 30 is provided above the substrate support 16. That is, the upper electrode 30 is provided above the lower electrode 18. The upper electrode 30 closes an upper opening of the chamber body 12 together with a member 32. The member 32 has insulation properties. The upper electrode 30 is supported on an upper portion of the chamber body 12 through the member 32.

The upper electrode 30 includes a ceiling plate 34 and a support 36. The lower surface of the ceiling plate 34 defines the internal space 10s. A plurality of gas discharge holes 34a are formed in the ceiling plate 34. Each of the plurality of gas discharge holes 34a penetrates the ceiling plate 34 in a plate thickness direction (a vertical direction). The ceiling plate 34 is formed of, for example, silicon. However, there is no limitation thereto. Alternatively, the ceiling plate 34 may have a structure in which a plasma-resistant film is provided on the surface of a member made of aluminum. This film may be a film formed by anodization or a ceramic film such as a film formed of yttrium oxide.

The support 36 detachably supports the ceiling plate 34. The support 36 is formed of a conductive material such as aluminum, for example. A gas diffusion chamber 36a is provided in the interior of the support 36. A plurality of gas holes 36b extend downward from the gas diffusion chamber 36a. The plurality of gas holes 36b communicate with the plurality of gas discharge holes 34a, respectively. The support 36 has a gas introduction port 36c formed therein. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply gases from one or more gas sources selected from the plurality of gas sources of the gas source group 40 to the internal space 10s at individually adjusted flow rates.

A baffle plate 48 is provided between the substrate support 16 or the supporting part 17 and the side wall of the chamber body 12. The baffle plate 48 may be configured, for example, by coating a plate member made of aluminum with ceramic such as yttrium oxide. The baffle plate 48 has a plurality of through-holes. An exhaust pipe 52 is connected to the bottom portion of the chamber body 12 below the baffle plate 48. An exhaust device 50 is connected to the exhaust pipe 52. The exhaust device 50 has a pressure controller such as an automatic pressure control valve, and a vacuum pump such as a turbo molecular pump, and is capable of reducing the pressure in the internal space 10s.

The plasma processing apparatus 1 is further provided with a radio frequency power source 61. The radio frequency power source 61 is a power source that generates radio frequency power RF. The radio frequency power RF is used to generate plasma from the gas in the chamber 10. The radio frequency power RF has a second frequency. The second frequency is a frequency within the range of 13 to 200 MHz, for example, a frequency of 40 MHz or 60 MHz. The radio frequency power source 61 is connected to the lower electrode 18 through a matching circuit 63 to supply the radio frequency power RF to the lower electrode 18. The matching circuit 63 is configured to match the impedance on the load side (the lower electrode 18 side) of the radio frequency power source 61 with the output impedance of the radio frequency power source 61. The radio frequency power source 61 may not be electrically connected to the lower electrode 18 and may be connected to the upper electrode 30 through the matching circuit 63.

The plasma processing apparatus 1 is further provided with a bias power source 62. The bias power source 62 is connected to the lower electrode 18 through a circuit 64. The bias power source 62 generates an electrical bias (bias power) EB. The electrical bias EB is used to draw ions into the substrate W. The electrical bias EB is set to vary a potential of the substrate W placed on the electrostatic chuck 20 within a cycle CP that is defined by a first frequency. The cycle CP is the reciprocal of a first frequency. The first frequency may be a frequency lower than the second frequency. The first frequency is, for example, a frequency of 50 kHz or more and 27 MHz or less.

Figure 2:
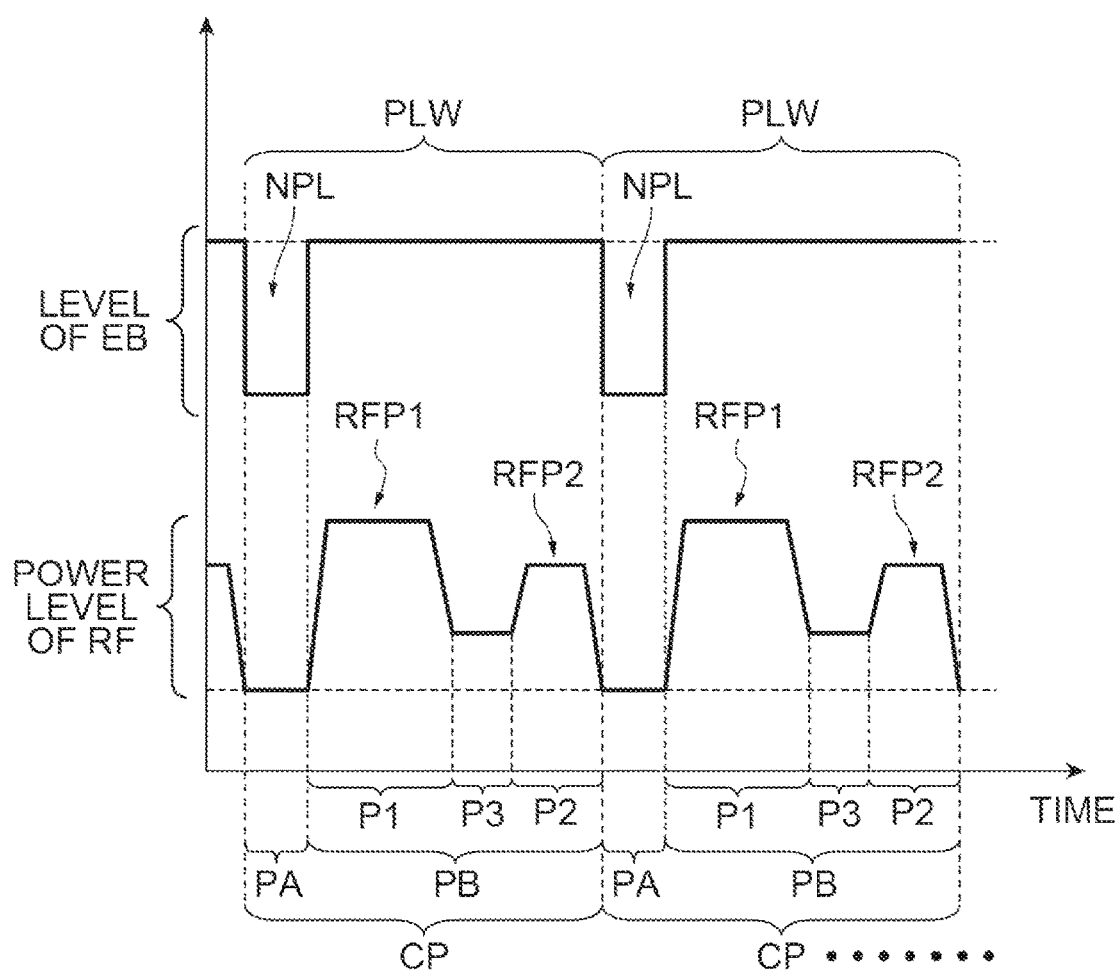
FIG. 2 is a timing chart of an example of radio frequency power and electrical bias which are used in the plasma processing apparatus according to an exemplary embodiment.
Figure 3:
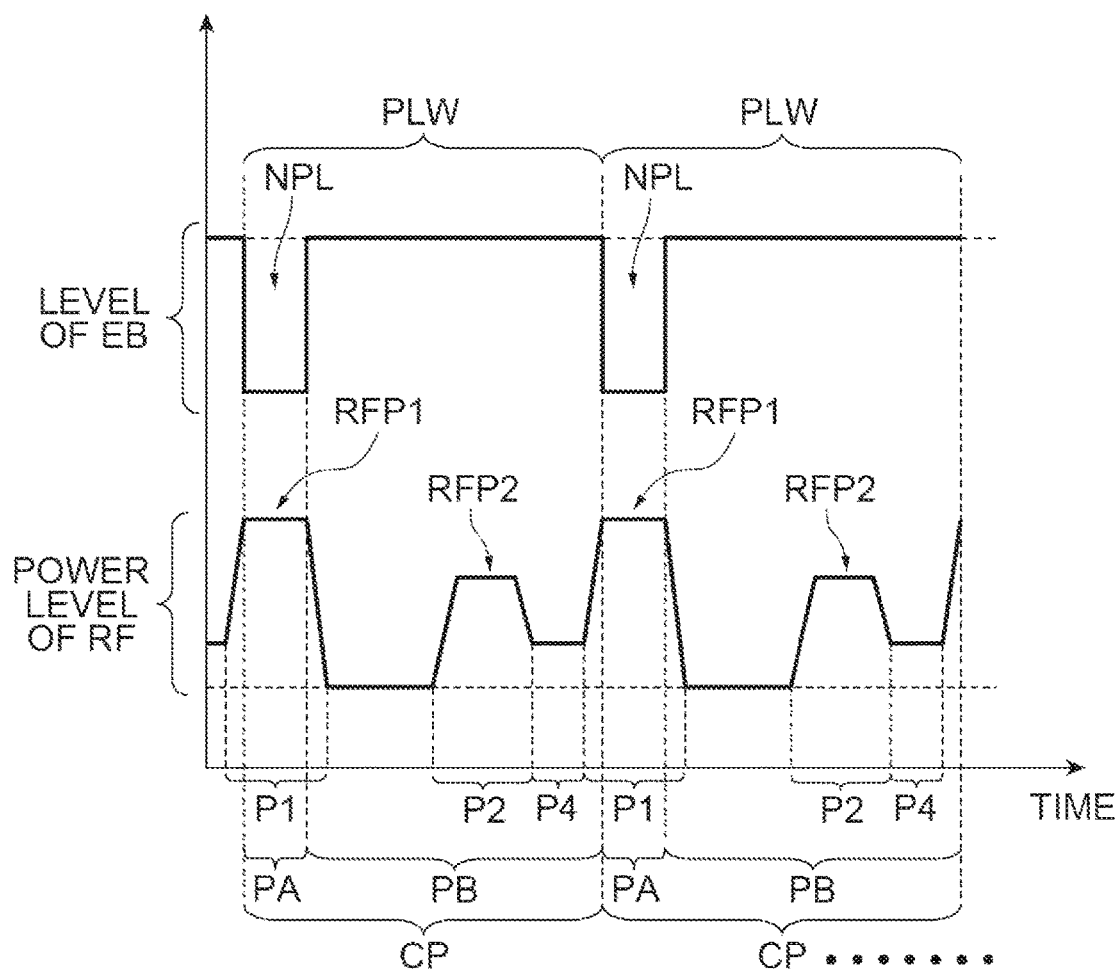
FIG. 3 is a timing chart of another example of the radio frequency power and the electrical bias which are used in the plasma processing apparatus according to an exemplary embodiment.

FIG. 2 is a timing chart of an example of the radio frequency power and the electrical bias which are used in the plasma processing apparatus according to an exemplary embodiment. FIG. 3 is a timing chart of another example of the radio frequency power and the electrical bias which are used in the plasma processing apparatus according to an exemplary embodiment. In an embodiment, as shown in FIG. 2 or FIG. 3, a pulse wave PLW is used as the electrical bias EB. In a case where the pulse wave PLW is used as the electrical bias EB, the circuit 64 includes a filter circuit that blocks or reduces the radio frequency power RF. The pulse wave PLW is applied to the lower electrode 18 periodically with the pulse cycle CP. The pulse wave PLW includes at least one bias pulse. In an embodiment, the pulse wave PLW includes a negative direct-current voltage pulse NPL. The pulse NPL is also applied to the lower electrode 18 periodically with the cycle CP. The pulse NPL is applied to the lower electrode 18 in a period PA within cycle CP. In a period PB other than the period PA within the cycle CP, the voltage level of the pulse wave PLW may be 0 V. Alternatively, the voltage level of the pulse wave PLW in the period PB may have an absolute value smaller than the absolute value of the voltage of the pulse NPL. Further, the voltage level of the pulse wave PLW in the period PB may have a positive value smaller than the value of the voltage of the pulse NPL. A start timing and time length of the cycle CP, the level of the voltage of the pulse wave PLW, and the proportion of the period PA in the cycle CP (that is, a duty ratio) are designated to the bias power source 62 by a control signal from a controller MC (described later).

In a case where plasma etching is performed in the plasma processing apparatus 1, a gas is supplied to the internal space 10s. Then, the radio frequency power RF is supplied, whereby the gas is excited in the internal space 10s. Further, the electrical bias EB is applied to the lower electrode 18, whereby ions from the plasma are drawn into the substrate W. Then, the substrate W is processed with chemical species such as ions and/or radicals from the plasma. For example, plasma etching of the substrate W is performed.

In the plasma processing apparatus 1, the radio frequency power source 61 supplies a first pulse RFP1 of the radio frequency power RF in a first period P1, as shown in FIG. 2 or FIG. 3. The first period P1 has a time length shorter than the time length of the cycle CP and at least partially overlaps the cycle CP. Further, the radio frequency power source 61 supplies a second pulse RFP2 of the radio frequency power RF in a second period P2. The second period P2 is a period different from the first period P1. The second period P2 has a time length shorter than the time length of the cycle CP and at least partially overlaps the cycle CP. A power level (a second power level) of the second pulse RFP2 is lower than a power level (a first power level) of the first pulse RFP1. The first period P1, the second period P2, and the power level of the radio frequency power RF may be designated to the radio frequency power source 61 by a control signal from the controller MC. The power level of the radio frequency power RF that may be designated to the radio frequency power source 61 includes the power level of the first pulse RFP1 and the power level of the second pulse RFP2.

In an embodiment, as shown in FIG. 2, each of the first period P1 and the second period P2 is a period within a period in which the pulse NPL is not supplied (that is, the period PB) within the cycle CP. In the period PB, the thickness of a sheath (plasma sheath) becomes thin and an impedance becomes small. Therefore, reflection with respect to each of the first pulse RFP1 and the second pulse RFP2 is suppressed. In this embodiment, as shown in FIG. 2, the radio frequency power source 61 may be configured to supply the radio frequency power RF in a third period P3 between the first period P1 and the second period P2. The power level of the radio frequency power RF which is supplied in the period P3 between the period P1 and the period P2 may have a third power level lower than the power level of the first pulse RFP1 and the power level of the second pulse RFP2 and larger than 0 W. In this embodiment, the power level of the radio frequency power RF in the period PA may be 0 W. Alternatively, the power level of the radio frequency power RF in the period PA may be larger than 0 W and lower than the power level of the first pulse, the power level of the second pulse, and the power level of the radio frequency power RF in the period P3.

In an embodiment, as shown in FIG. 3, the first period P1 overlaps the period PA in which the pulse NPL is supplied. In this embodiment, the second period P2 is a period within the period in which the pulse NPL is not supplied (that is, the period PB) within the cycle CP. In this embodiment, as shown in FIG. 3, the radio frequency power source 61 may be configured to supply the radio frequency power RF in a fourth period P4 between the second period P2 and the point in time of end of the cycle CP which includes the second period P2 (or the point in time of start of the next cycle CP). The power level of the radio frequency power RF which is supplied in the period P4 after the period P2 may have a fourth power level lower than the power level of the first pulse RFP1 and the power level of the second pulse RFP2 and larger than 0 W. In this embodiment, the power level of the radio frequency power RF in the period between the first period P1 and the second period P2 may be 0 W. Alternatively, the power level of the radio frequency power RF in the period between the first period P1 and the second period P2 may be larger than 0 W and lower than the power level of the first pulse, the power level of the second pulse, and the power level of the radio frequency power RF in the period P4.

In an embodiment, the plasma processing apparatus 1 may be further provided with a sheath adjuster 74, as shown in FIG. 1. The sheath adjuster 74 is configured to adjust the upper end position of the sheath above the edge ring ER in order to correct a traveling direction of ions from the plasma with respect to the edge of the substrate W in the vertical direction. The sheath adjuster 74 adjusts the upper end position of the sheath above the edge ring ER to eliminate or reduce the difference between the upper end position of the sheath above the edge ring ER and the upper end position of the sheath above the substrate W.

In an embodiment, the sheath adjuster 74 is a power source configured to apply a voltage $V_N$ to the edge ring ER. The voltage $V_N$ may be a negative voltage. The voltage $V_N$ may be a voltage having the same waveform as that of the electrical bias EB. In this embodiment, the sheath adjuster 74 is connected to the edge ring ER through a filter 75 and a conducting wire 76. The filter 75 is a filter for blocking or reducing the radio frequency power flowing into the sheath adjuster 74.

The level of the voltage $V_N$ determines the amount of adjustment of the upper end position of the sheath above the edge ring ER. The amount of adjustment of the upper end position of the sheath above the edge ring ER, that is, the level of the voltage $V_N$, is determined according to a parameter representing the thickness of the edge ring ER. This parameter may be the measured value of the thickness of the edge ring ER which is optically or electrically measured, the position in the vertical direction of the upper surface of the edge ring ER which is optically or electrically measured, or a time length in which the edge ring ER is exposed to plasma. The level of the voltage $V_N$ is determined using a predetermined relationship between such a parameter and the level of the voltage $V_N$. For example, the predetermined relationship between the parameter and the level of the voltage $V_N$ is determined in advance such that the absolute value of the voltage $V_N$ increases as the thickness of the edge ring ER decreases. This relationship is stored in a storage device of the controller MC, (described later) as a function or data in a table format. The level of the voltage $V_N$ is determined by the controller MC and designated with respect to the sheath adjuster 74. When the voltage $V_N$ having a determined level is applied to the edge ring ER by the sheath adjuster 74, the difference between the upper end position of the sheath above the edge ring ER and the upper end position of the sheath above the substrate W is eliminated or reduced.

The voltage which is applied to the edge ring ER by the sheath adjuster 74 may be a direct-current voltage or a radio frequency voltage. The voltage which is applied to the edge ring ER may be a voltage having the same waveform as that of the electrical bias EB. The voltage which is applied to the edge ring ER by the sheath adjuster 74 may be a pulsed radio frequency voltage or a pulsed direct-current voltage. That is, the voltage $V_N$ may be periodically applied to the edge ring ER. The voltage $V_N$ may be applied to the edge ring ER, for example, in the period PA within the cycle CP or in a period that overlaps the period PA. In a case where a pulsed direct-current voltage is periodically applied to the edge ring ER as the voltage $V_N$, the level of the voltage $V_N$ may change in the period in which the voltage $V_N$ is applied to the edge ring ER.

The controller MC is a computer which includes a processor, a storage device, an input device, a display device, and the like, and controls each part of the plasma processing apparatus 1. The controller MC executes a control program stored in the storage device and controls each part of the plasma processing apparatus 1, based on recipe data stored in the storage device. A process designated by the recipe data is performed in the plasma processing apparatus 1 by the control by the controller MC. A plasma processing method according to an exemplary embodiment to be described later may be performed in the plasma processing apparatus 1 by the control of each part of the plasma processing apparatus 1 by the controller MC.

In a case where the radio frequency power RF is continuously supplied, that is, in a case where the continuous wave of the radio frequency power RF is supplied, the density of the plasma in the chamber 10 becomes high at the center (that is, the position on the axis AX and the vicinity thereof) and becomes low on the outer side in the radial direction. In the plasma processing apparatus 1, the radio frequency power RF is supplied as the first pulse RFP1. Therefore, according to the plasma processing apparatus 1, the uniformity of the density distribution in the radial direction of the plasma becomes high. Further, in the plasma processing apparatus 1, after the supply of the first pulse RFP1, the second pulse RFP2 of the radio frequency power RF having relatively low power is supplied. Therefore, according to the plasma processing apparatus 1, it becomes possible to prevent a decrease or disappearance of the density of the plasma.

Figure 4:
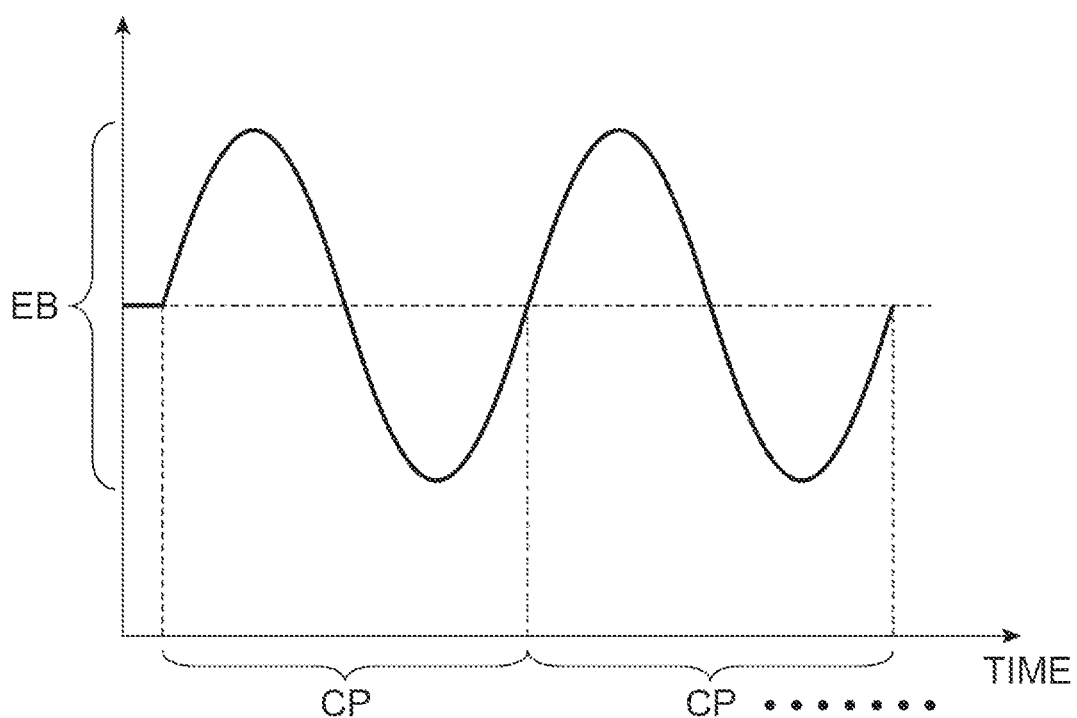
FIG. 4 is a timing chart of still another example of the electrical bias which is used in the plasma processing apparatus according to an exemplary embodiment.

Hereinafter, FIG. 4 will be referred to. FIG. 4 is a timing chart of still another example of the electrical bias which is used in the plasma processing apparatus according to an exemplary embodiment. As shown in FIG. 4, the bias power source 62 of the plasma processing apparatus 1 may supply radio frequency (RF) bias power to the lower electrode 18 as the electrical bias EB. The radio frequency bias power has the first frequency described above. In this embodiment, the circuit 64 is a matching circuit and is configured to match the impedance on the load side (the lower electrode 18 side) of the bias power source 62 with the output impedance of the bias power source 62.

In a case where the radio frequency bias power is used as the electrical bias EB, each of the first pulse RFP1 and the second pulse RFP2 may be supplied when the impedance of a load on the bias power source 62 is in a substantially matched state. That is, each of the first period P1 and the second period P2 may overlap a period in which the impedance of the load on the bias power source 62 is in a substantially matched state with respect to the output impedance of the bias power source 62 within the cycle CP. The load with respect to the bias power source 62 includes the plasma which is generated in the chamber 10.

Figure 5:
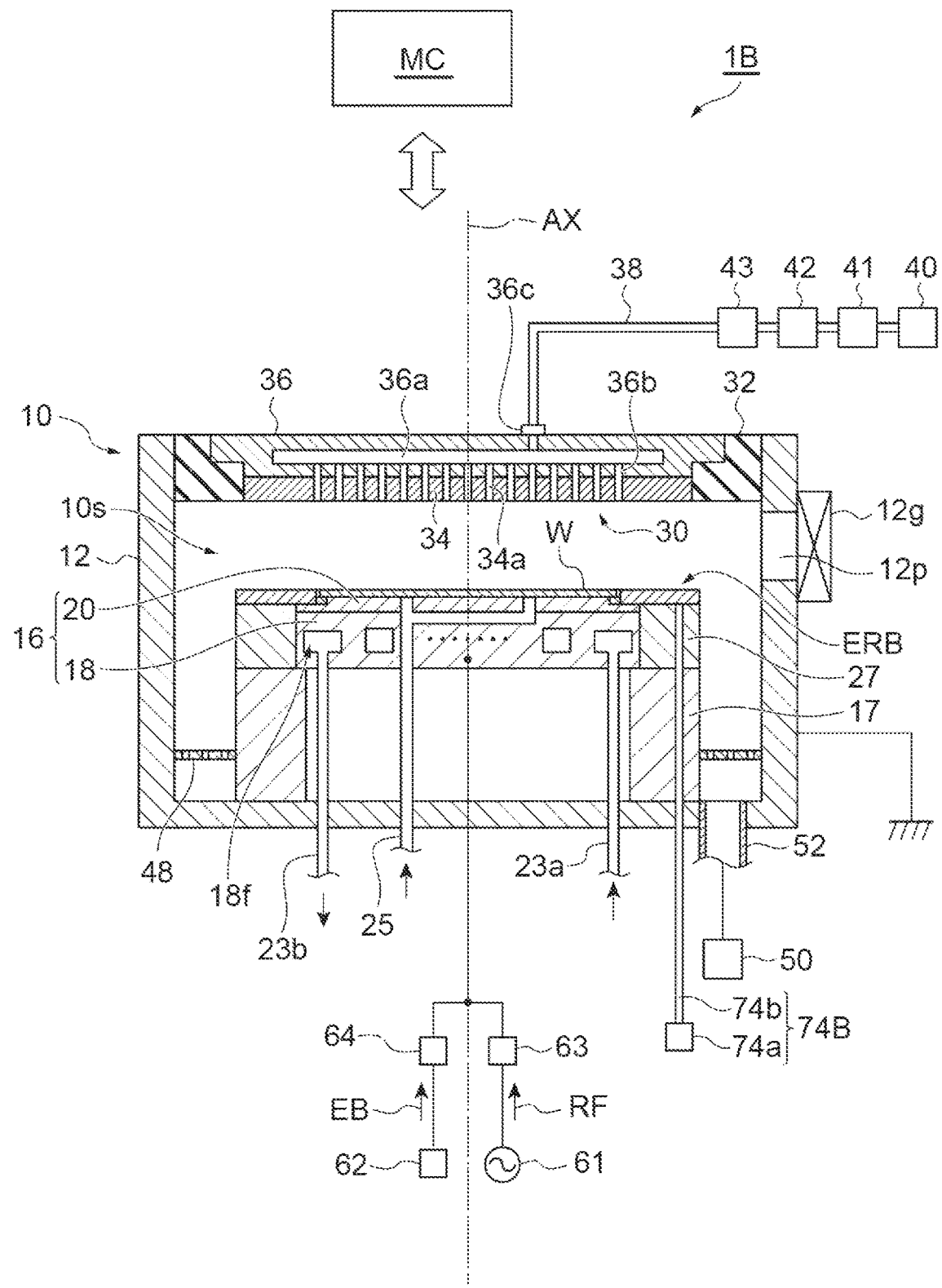
FIG. 5 schematically illustrates a plasma processing apparatus according to another exemplary embodiment.
Figure 6:
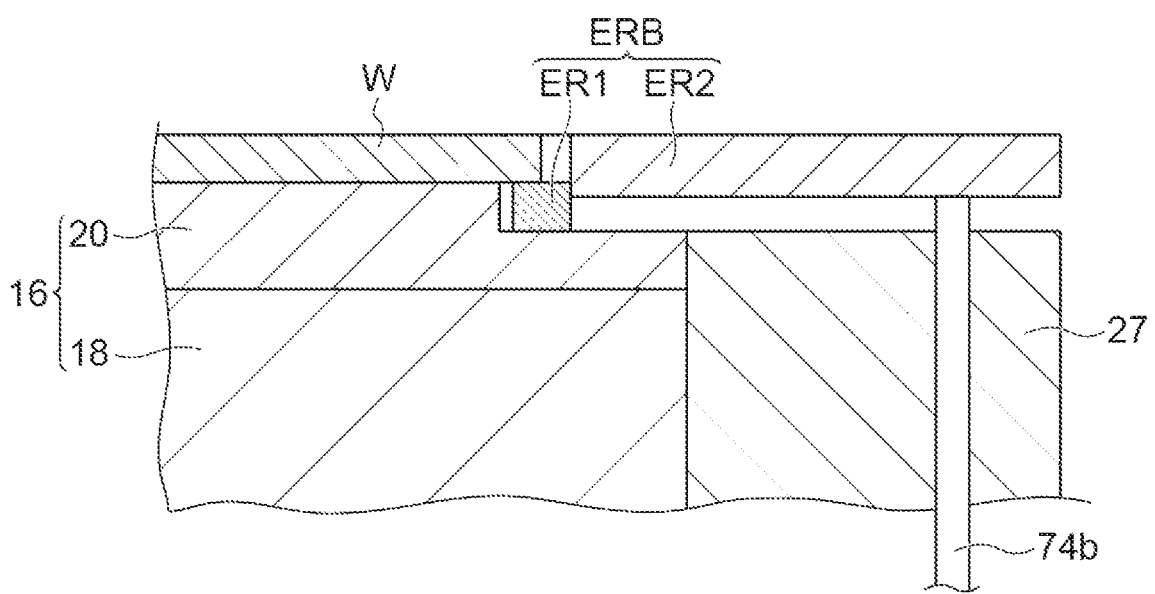
FIG. 6 illustrates an example of an edge ring which may be used in the plasma processing apparatus shown in FIG. 5.

Hereinafter, FIGS. 5 and 6 will be referred to. FIG. 5 schematically illustrates a plasma processing apparatus according to another exemplary embodiment. FIG. 6 illustrates an example of an edge ring which may be used in the plasma processing apparatus shown in FIG. 5. A plasma processing apparatus 1B shown in FIG. 5 is different from the plasma processing apparatus 1 in that an edge ring ERB is used instead of the edge ring ER. Further, the plasma processing apparatus 1B is different from the plasma processing apparatus 1 in that a sheath adjuster 74B is provided instead of the sheath adjuster 74. In other respects, the configuration of the plasma processing apparatus 1B may be the same as the configuration of the plasma processing apparatus 1.

As shown in FIG. 6, the edge ring ERB has a first annular part ER1 and a second annular part ER2. The first annular part ER1 and the second annular part ER2 are separated from each other. The first annular part ER1 has an annular plate shape and is placed on the edge ring placing region to extend around the axis AX. The substrate W is placed on the substrate placing region such that the edge thereof is located on or above the first annular part ER1. The second annular part ER2 has an annular plate shape and is placed on the edge ring placing region to extend around the axis AX. The second annular part ER2 is located outside the first annular part ER1 in the radial direction.

The sheath adjuster 74B is configured to move the second annular part ER2 upward in order to adjust the position in the vertical direction of the upper surface of the second annular part ER2. In an example, the sheath adjuster 74B includes a drive device 74a and a shaft 74b. The shaft 74b supports the second annular part ER2 and extends downward from the second annular part ER2. The drive device 74a is configured to generate a driving force for moving the second annular part ER2 along the vertical direction through the shaft 74b.

The sheath adjuster 74B is configured to adjust the amount of adjustment of the upper end position of the sheath above the edge ring ERB, that is, the position in the vertical direction of the upper surface of the second annular part ER2, in order to correct the traveling direction of ions from the plasma with respect to the edge of the substrate W in the vertical direction. The sheath adjuster 74B adjusts the second annular part ER2 along the vertical direction to make the position in the vertical direction of the upper surface of the second annular part ER2 coincide with the position in the vertical direction of the upper surface of the substrate W on the electrostatic chuck 20.

The amount of adjustment of the upper end position of the sheath above the edge ring ERB, that is, the amount of movement of the second annular part ER2, is determined according to a parameter reflecting the thickness of the edge ring ERB, that is, the thickness of the second annular part ER2. This parameter may be the measured value of the thickness of the second annular part ER2 which is optically or electrically measured, the position in the vertical direction of the upper surface of the second annular part ER2 which is optically or electrically measured, or a time length in which the edge ring ERB is exposed to plasma. The amount of movement of the second annular part ER2 is determined using a predetermined relationship between such a parameter and the amount of movement of the second annular part ER2. For example, the predetermined relationship between the parameter and the amount of movement of the second annular part ER2 is determined in advance such that the amount of movement of the second annular part ER2 increases as the thickness of the second annular part ER2 decreases. When the second annular part ER2 is moved upward by the determined amount of movement, the difference between the upper end position of the sheath on the edge ring ERB and the upper end position of the sheath above the substrate W is eliminated or reduced.

In the plasma processing apparatus 1B, the controller MC may determine the amount of movement of the second annular part ER2, as described above. The predetermined relationship between the parameter described above and the amount of movement of the second annular part ER2 may be stored in the storage device of the controller MC as a function or data in a table format. The controller MC may control the sheath adjuster 74B to move the second annular part ER2 upward by the determined amount of movement.

Figure 7:
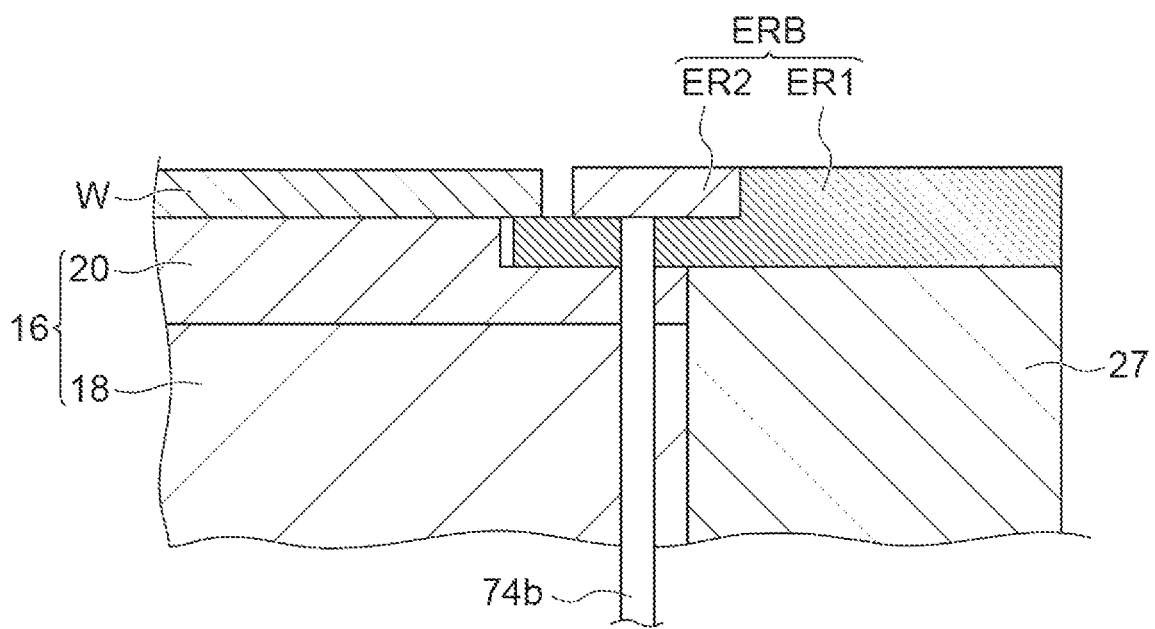
FIG. 7 illustrates another example of the edge ring.

FIG. 7 illustrates another example of the edge ring. In the edge ring ERB shown in FIG. 7, the first annular part ER1 has an inner peripheral portion and an outer peripheral portion. The position in the vertical direction of the upper surface of the inner peripheral portion is lower than the position in a height direction in the vertical direction of the upper surface of the outer peripheral portion. The substrate W is placed on the substrate placing region such that the edge thereof is located on the inner peripheral portion of the first annular part ER1. The second annular part ER2 is disposed on the inner peripheral portion of the first annular part ER1 to surround the edge of the substrate W. That is, in the edge ring ERB shown in FIG. 7, the second annular part ER2 is disposed inside the outer peripheral portion of the first annular part ER1. In a case where the edge ring ERB shown in FIG. 7 is used, the shaft 74b of the sheath adjuster 74B can reach the lower surface of the second annular part ER2 through a through-hole formed in the inner peripheral portion of the first annular part ER1.

Hereinafter, FIG. 8 is referred to. FIG. 8 is a flowchart of a plasma processing method according to an exemplary embodiment. The plasma processing method (hereinafter referred to as a "method MT") shown in FIG. 8 is executed by using any one of plasma processing apparatuses according to various embodiments, such as the plasma processing apparatus 1 and the plasma processing apparatus 1B described above.

The method MT starts with step ST1. In step ST1, the substrate W is prepared in the chamber 10. In the chamber 10, the substrate W is placed on the electrostatic chuck 20. Steps ST2, ST3, and ST4 of the method MT are performed in a state where the substrate W is placed on the electrostatic chuck 20. In the method MT, a gas is supplied from the gas supply unit into the chamber 10. Then, the pressure in the chamber 10 is set to a designated pressure by the exhaust device 50.

In step ST2, the electrical bias EB is supplied to the lower electrode 18. In step ST3, the first pulse RFP1 of the radio frequency power RF is supplied in the first period P1. In step ST4, the second pulse RFP2 of the radio frequency power RF is supplied in the second period P2.

In step ST5, it is determined whether or not an end condition is satisfied. The end condition is satisfied in a case where the number of repetitions of the cycle CP reaches a predetermined number of times. When it is determined in step ST5 that the end condition is not satisfied, step ST2, step ST3, and step ST4 are performed again. On the other hand, when it is determined in step ST5 that the end condition is satisfied, the method MT ends.

While various exemplary embodiments have been described above, various additions, omissions, substitutions and changes may be made without being limited to the exemplary embodiments described above. Elements of the different embodiments may be combined to form another embodiment.

In another embodiment, the plasma processing apparatus may be an inductively coupled plasma processing apparatus, an ECR (electron cyclotron resonance) plasma processing apparatus, or a plasma processing apparatus that generates plasma by using surface waves such as microwaves.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a plasma processing chamber;
a substrate support disposed in the plasma processing chamber and including an electrode;
an electric bias generator coupled to the electrode and configured to generate an electric bias having a first voltage level in a first period within one cycle and a second voltage level in second and third periods within the one cycle, an absolute value of the first voltage level being greater than an absolute value of the second voltage level; and
a radio frequency power source coupled to the plasma processing chamber and configured to generate a radio frequency power having a first power level in the first period within the one cycle, a second power level in the second period within the one cycle, and a third power level in the third period within the one cycle, the second power level being greater than the third power level, and the third power level being greater than the first power level.

2. The plasma processing apparatus according to claim 1, wherein the electric bias has a pulse waveform, in the first period, of a rectangular shape, a trapezoidal shape, a triangular shape, or a combination thereof.

3. The plasma processing apparatus according to claim 1, wherein the electric bias has a shaped pulse in the first period.

4. The plasma processing apparatus according to claim 1, wherein the first voltage level has a negative polarity.

5. The plasma processing apparatus according to claim 1, wherein the second voltage level is zero voltage level.

6. The plasma processing apparatus according to claim 5, wherein the first power level is zero power level.

7. The plasma processing apparatus according to claim 1, wherein the radio frequency power has a fourth power level in a fourth period between the second period and the third period within the one cycle, the fourth power level is between the first power level and the third power level.

8. The plasma processing apparatus according to claim 7, wherein the electric bias has the second voltage level in the fourth period within the one cycle.

9. A plasma processing method for use in a plasma processing apparatus, the plasma processing apparatus including a plasma processing chamber, a substrate support disposed in the plasma processing chamber and including a lower electrode, and an upper electrode disposed above the lower electrode, the plasma processing method comprising:
placing a substrate on the substrate support;
supplying an electric bias to the lower electrode, the electric bias having a first voltage level in a first period within one cycle and a second voltage level in second and third periods within the one cycle, an absolute value of the first voltage level being greater than an absolute value of the second voltage level; and
supplying a radio frequency power to the upper electrode or the lower electrode, the radio frequency power having a first power level in the first period within the one cycle, a second power level in the second period within the one cycle, and a third power level in the third period within the one cycle, the second power level being greater than the third power level, and the third power level being greater than the first power level.

10. A plasma processing apparatus comprising:
a plasma processing chamber;
a substrate support disposed in the plasma processing chamber and including an electrode;
an electric bias generator coupled to the electrode and configured to generate an electric bias having a first voltage level in a first period within one cycle and a second voltage level in second to fourth periods within the one cycle, an absolute value of the first voltage level being greater than an absolute value of the second voltage level; and
a radio frequency power source coupled to the plasma processing chamber and configured to generate a radio frequency power having a first power level in the first period within the one cycle, a second power level in the second period within the one cycle, a third power level in the third period within the one cycle, and a fourth power level in the fourth period within the one cycle, the first power level being greater than the third power level, the third power level being greater than the fourth power level, and the fourth power level being greater than the second power level.

11. The plasma processing apparatus according to claim 10, wherein the electric bias has a pulse waveform, in the first period, of a rectangular shape, a trapezoidal shape, a triangular shape, or a combination thereof.

12. The plasma processing apparatus according to claim 10, wherein the electric bias has a shaped pulse in the first period.

13. The plasma processing apparatus according to claim 10, wherein the first voltage level has a negative polarity.

14. The plasma processing apparatus according to claim 10, wherein the second voltage level is zero voltage level.

* * * * *